United States Patent Office 3,156,539

Patented Nov. 10, 1964

3,156,539
SUPERCONDUCTIVE MATERIALS

Harry N. Treaftis, Lee, and Charles E. Watts, Jr., Pittsfield, Mass., assignors to General Electric Company, a corporation of New York No Drawing. Filed Mar. 27, 1962, Ser. No. 182,927
1 Claim. (Cl. 29—194)

This invention relates to superconductive materials. More particularly, it relates to a superconductive solder which is useful in connection with superconductive devices and circuits and as a superconductive element itself.

The use of superconductive circuits and devices using such circuits, which at very low temperatures exhibit no electrical resistance, is well known. Among such devices and the equipment in which they are used are the well-known cryotron, computers, infrared sensors, cryogenic gyros, magnetic shielding films and the like. Superconductive materials or elements, such as tin, lead, aluminum, vanadium, indium, and the like, are generally used in the form of very fine wires or very thin films which are very delicate and, because of their fineness, very subject to destruction by the application of physical force or heat. This susceptibility to heat, combined with the desire to limit the size of circuits and devices employing such materials with their desirable electrical characteristics, creates a definite problem when the small elements of such devices are to be joined together. While superconductive solders present a satisfactory means for joining superconductive elements, it will be quite obvious that the use of ordinary heat-melted solders would destroy the fine superconductive elements themselves upon the application of the heat necessary to fuse the solder to the elements to be joined. From the above, it will be quite evident that there is a definite need for easy and convenient superconductive means for joining superconductive elements which will be of a size compatible with the size of the elements themselves and which means may be applied without heating or destroying the elements.

It is, therefore, a principal object of this invention to provide improved means for joining together superconductive elements.

It is a further object of the invention to provide a superconductive material which, while it has as its primary use the joining of other elements, may in and of itself be used as a convenient superconductive element where indicated.

Briefly, the present invention relates to a superconductive alloy comprising mercury, silver, tin, copper and zinc which may be used as a cold or room temperature solder for joining together superconductive elements or which may be used as a superconductive element in and of itself.

Those features of the invention which are believed to be novel are set forth in the claims appended hereto. The invention will, however, be better understood and further advantages and uses thereof appreciated from a consideration of the following description.

The alloy of the invention comprises by weight two parts of mercury and one part by weight of a dental alloy consisting of 65 percent silver, minimum; 25 percent tin, minimum; 6 percent copper, maximum; and 2 percent zinc, maximum. While the above combination has been found to be most suitable in connection with superconductive elements, it will be realized that the proportions of the ingredients can be altered to some degree without detracting radically from the characteristics of the material. In preparing the superconductive material, the alloy of silver, tin, copper and zinc is merely amalgamated with the mercury by mixing in any convenient way.

The critical temperature of the preferred material is 4.15° K. The flowable amalgamated material, when applied to join superconductive elements, hardens in about one hour at room temperature and, of course, can be applied at room temperature which obviates any deterioration of the superconductive elements due to heat. The material is particularly valuable in joining superconductive elements consisting of metals such as lead, tin, niobium, indium, and the like.

Alternatively, the present material can itself be spread in the form of films on paper, cloth, plastic or other suitable bases to form superconductvie elements which after about one hour or less at room temperature will convert to a hardened state.

From the above, it will be seen that there is provided by the present invention a superconductive material which can be used as a room temperature solder to connect superconductvie elements by merely applying the material to the superconductive elements without possibility of damage attendant to the use of solders which must be heated. Furthermore, it will be seen that there are provided by this invention superconductive materials which may be used as superconductive elements by themselves by simply spreading them in the form of a film. As pointed out above, the present materials find uses in cryotrons, computers, IR sensors, cryogenic gyros, magnetic shielding films and superconductive circuits in general, including printed circuits.

What we claim as new and desire to secure by Letters Patent of the United States is:

A superconductive circuit comprising superconductive elements joined together with a superconductive material consisting essentially of by weight two parts of mercury and one part by weight of a material consisting essentially of about 65 percent silver, minimum; about 25 percent tin, minimum; 6 percent copper, maximum; and 2 percent zinc, maximum.

References Cited in the file of this patent

UNITED STATES PATENTS

| | | |
|---|---|---|
| 2,281,991 | Poetschke | May 5, 1942 |
| 2,767,287 | Kahan | Oct. 6, 1956 |